(12) United States Patent
Meijer et al.

(10) Patent No.: US 9,240,306 B2
(45) Date of Patent: Jan. 19, 2016

(54) DEVICE FOR SPOT SIZE MEASUREMENT AT WAFER LEVEL USING A KNIFE EDGE AND A METHOD FOR MANUFACTURING SUCH A DEVICE

(71) Applicant: Mapper Lithography IP B.V., Delft (NL)

(72) Inventors: Jan Andries Meijer, Rotterdam (NL); Paul IJmert Scheffers, Delft (NL); Abdourahmane Ange Sarr, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/373,893

(22) PCT Filed: Dec. 5, 2012

(86) PCT No.: PCT/NL2012/050854
§ 371 (c)(1),
(2) Date: Jul. 22, 2014

(87) PCT Pub. No.: WO2013/112041
PCT Pub. Date: Aug. 1, 2013

(65) Prior Publication Data
US 2015/0001423 A1   Jan. 1, 2015

Related U.S. Application Data

(60) Provisional application No. 61/589,966, filed on Jan. 24, 2012.

(30) Foreign Application Priority Data

Jan. 24, 2012   (NL) .................................... 2008174

(51) Int. Cl.
*H01J 37/00* (2006.01)
*H01J 37/252* (2006.01)
(Continued)

(52) U.S. Cl.
CPC ............... *H01J 37/252* (2013.01); *B82Y 10/00* (2013.01); *B82Y 40/00* (2013.01); *H01J 37/09* (2013.01);
(Continued)

(58) Field of Classification Search
CPC ................ H01J 2237/2443; H01J 37/3045; H01J 37/3174; H01J 37/3177; H01J 2237/2446; H01J 37/244
USPC .......................................... 250/492.1–492.3
See application file for complete search history.

(56) References Cited

U.S. PATENT DOCUMENTS 3,522,528 A    8/1970  Towner
6,531,411 B1   3/2003  Domenicucci et al.
(Continued)

FOREIGN PATENT DOCUMENTS

EP    1755001    2/2007
GB    2099626    2/1982
(Continued)

OTHER PUBLICATIONS

Rishton, et al "Measurement of the profile of finely focused electron beams in a scanning electron microscope" J. Phys. E. Sci. Instrum. vol. 17, 1994, pp. 296-303.*
(Continued)

*Primary Examiner* — Michael Maskell
(74) *Attorney, Agent, or Firm* — Blakely Sokoloff Taylor & Zafman LLP (57) ABSTRACT

The invention relates to a device for spot size measurement at wafer level in a multi charged particle beam lithography system. The device comprises a knife edge structure on top of a scintillating material, such a YAG material. The knife edge structure is arranged in a Si wafer which has a top plane at a sharp angle to a (1 1 0) plane of the Si. In an embodiment the angle is in the range from 2 to 4 degrees, preferably in the range from 2.9-3.1 degrees. The invention relates in addition to a method for manufacturing a device for spot size measurement at wafer level in a multi charged particle beam lithography system.

37 Claims, 7 Drawing Sheets

(51) Int. Cl.
- *H01J 37/09* (2006.01)
- *H01J 37/244* (2006.01)
- *H01J 37/30* (2006.01)
- *H01J 37/317* (2006.01)
- *B82Y 10/00* (2011.01)
- *B82Y 40/00* (2011.01)

(52) U.S. Cl.
CPC ........... *H01J 37/244* (2013.01); *H01J 37/3002* (2013.01); *H01J 37/3005* (2013.01); *H01J 37/3174* (2013.01); *H01J 37/3177* (2013.01); *H01J 2237/2001* (2013.01); *H01J 2237/24521* (2013.01); *H01J 2237/2802* (2013.01); *H01J 2237/30477* (2013.01); *H01J 2237/31793* (2013.01)

(56) References Cited

U.S. PATENT DOCUMENTS

| | | | |
|---|---|---|---|
| 7,642,529 | B2 | 1/2010 | Gupta et al. |
| 2002/0113214 | A1 | 8/2002 | Yahiro |
| 2007/0057204 | A1* | 3/2007 | Kruit et al. ............... 250/492.23 |
| 2011/0204253 | A1* | 8/2011 | Platzgummer et al. ... 250/396 R |
| 2011/0253900 | A1* | 10/2011 | Hanfoug ....................... 250/369 |

FOREIGN PATENT DOCUMENTS

| | | |
|---|---|---|
| JP | 04148546 | 5/1992 |
| JP | 2007-066072 | 3/2007 |

OTHER PUBLICATIONS

Kratschmer, et al "Quantitative analysis of resolution and stability in nanometer electron beam lithography" J. Vac. Sci. Technol. Nov./Dec. 1998 pp. 2074-2079.*

Yamazaki, K., et al; Electron-Beam Diameter Measurement Using a Knife Edge with a Visor for Scattering Electrons; Jpn. J. Appl. Phys.; vol. 42 (2003); pp. L491-L493.

Kratschmer, E., et al.; Quantitative analysis of resolution and stability in nanometer electron beam lithography; Journal of Vacuum Science & Technology; Nov./Dec. 1998; pp. 2074-2079.

Rishton, S.A., et al.; Measurement of the profile of finely focused electron beams in a scanning electron microscope; J. Phys. E: Sci. Instrum, vol. 17, 1994; pp. 296-303.

Wind, Rikard A., et al; Orientation-Resolved Chemical Kinetics: Using Microfabrication to Unravel the Complicated of KOH/Si Etching; J. Phys. Chem, 2002; pp. 1557-1569.

* cited by examiner

DEVICE FOR SPOT SIZE MEASUREMENT AT WAFER LEVEL USING A KNIFE EDGE AND A METHOD FOR MANUFACTURING SUCH A DEVICE

BACKGROUND

The invention relates to a device for measuring the spot size of a charged particle beam at wafer level in a charged particle beam lithography system, and a method for manufacturing such a device.

In order to measure the spot size of scanning electron microscope columns, and those used in electron-beam lithography machines, the reflected or transmitted current of a beam is measured as the beam is scanned across a sharp edge, also referred to as 'knife edge'. Such a method is for example described in J. Phys. E: Sci. Instrum. 17 296, 1984, by S. A. Rishton et. al.

Applying such a method for spot size measurement in a production charged particle beam lithography system, in particular a lithography system having multiple beams, is not straight-forward and poses problems and challenges unknown in research lithography systems:

On the one hand, a production charged particle beam lithography system may use more than 10,000 charged particle beams. In view of this it would be highly desirable to be able to measure a set of charged particle beams simultaneously.

On the other hand, these large number of charged particle beams have a very small spot size and are very tightly packed. The spot size of each charged particle beam can be down to 20 nm or even less, and the pitch between adjacent charged particle beams can be smaller than 100 nm.

It is an object of the present invention to provide a device and a method for spot size measurement at wafer level in a production charged particle beam lithography system.

DETAILED DESCRIPTION OF THE INVENTION

According to a first aspect, the invention provides a device for spot size measurement at wafer level in a multi charged particle beam lithography system, comprising a knife edge (KE) structure on top of a scintillating material, characterized in that the knife edge (KE) structure is arranged in a Si wafer which has a top plane at a sharp angle to a (1 1 0) plane of the Si.

Usually Si wafers are cut along one of the crystal planes, which crystal planes are denoted in this application using the Miller indices notation. The invention uses an etched KE structure in a mis-cut Si wafer. Such a mis-cut Si wafer is not cut along one of the crystal planes, but is cut such that the top plane is arranged at a sharp angle to the (1 1 0) crystal plane of the Si. In the context of this application, a sharp angle is an angle larger than 0°, but smaller than 90°.

When etching a through opening in such a mis-cut Si wafer, in particular using wet etching agents such as KOH, the obtained through opening comprises at least one edge with an undercut angle which is suitable for use as a KE, when the top plane of mis-cut Si wafer is substantially arranged in the focus plane of the charged particle beams of the multi charged particle beam lithography system. In other words, the Si wafer with KE structure according to the invention can be arranged such that the top plane is substantially perpendicular to an optical axis of the charged particle beams. In the context of this application, the undercut angle is the angle between the side wall of the KE and a plane perpendicular to the top plane of the wafer.

Using a Si KE was already described in the 1984 paper by Rishton et. al. However, using a Si KE as known is not a viable solution for multi beam sensoring, because of the necessity of tilting the silicon knife edge with respect to the focus plane of the electron beam.

In an embodiment, the sharp angle is an angle in a range from 2 to 4 degrees. Using a Si wafer which is mis-cut using an angle within this range with respect to the (1 1 0) crystal plane, provides a KE having a side wall with a small undercut angle. Such a KE yields a large reduction of scattering of charged particles from the side wall of the KE. Without the undercut side wall, scattered charged particles disturb the measurement of the spot size of a charged particle beam.

When using a large undercut angle, on the other hand, the edge of the KE may become thin and at least partially transparent for charged particles. Such a KE does not completely block the charged particle beam, up to the edge. The result is that the edge is not well defined, which leads to a reduction in the resolution of the measuring device.

In an embodiment, the angle is in a range from 2.9-3.1 degrees.

In an embodiment the [0 0 1] direction in the Si crystal is used as the axis of rotation for providing the sharp angle between the top plane and the (1 1 0) plane. Using a wafer which is mis-cut with respect to the (1 1 0) crystal plane at a sharp angle of rotation around the [0 0 1] direction, provides two edges which are suitable for use as KE; a first edge between the top plane and the (1 −1 −1) crystal plane and a second edge between the top plane and the (1 −1 1) crystal plane.

The angle between the (1 −1 −1) and the (1 −1 1) planes is approximately 109°, providing two independent directions for KE measurements. By moving the mis-cut wafer with the two KE and the charged particle beams with respect to each other in a first direction substantially perpendicular to the first edge, the spot size of the charged particle beams in this first direction can be obtained. By moving the mis-cut wafer with the two KE and the charged particle beams with respect to each other in a second direction substantially perpendicular to the second edge, the spot size of the charged particle beams in this second direction can be obtained. These two measurements can be performed without having to rearrange the mis-cut wafer with the two KE in the charged particle beam lithography system. Combining these two measurements yields information about the spot size of the charged particle beams in two dimensions.

In an embodiment, the thickness of the Si Wafer at and around the knife edge structure has been reduced. In an embodiment, the thickness of the Si Wafer at and around the knife edge structures is in a range from 10 to 20 micron. The typical thickness of the Si Wafer is approximately 200-400 micron. By removing the bulk Si material under the knife edge structure at and around the knife edge structure, the side walls of this bulk Si material under the knife edge structure are arranged at a distance with respect to the knife edge structures. This at least substantially prevents that charged particles incident on the side walls and be scattered by the side walls of this bulk Si material. Such scattered charged particles would otherwise disturb the measurement when they reach the scintillating material and/or the detector.

In an embodiment, the mis-cut wafer is a SOI wafer. In an embodiment, the SOI wafer comprises a bulk Si layer, topped by a thin Si top layer, wherein a layer of SiO2 is arranged between the bulk layer and the thin Si top layer. For example, the bulk Si layer has a thickness of approximately 330 micron, whereas the thin top layer has a thickness of approximately 8 micron. In an embodiment, the knife edge structures are arranged in the thin top layer.

In an embodiment, the Si Wafer at and around the knife edge structures is provided with support walls. In an embodiment, the support walls have a height, as measured in a direction perpendicular to the top plane of the Wafer, in a range from 130 to 300 micron.

In an embodiment, the knife edge structures comprises one or more elongated trenches. When such a structure is also provided with support walls, these support walls extend at least substantially perpendicular to a longitudinal direction of said one or more elongated trenches.

In an embodiment, the mis-cut Si wafer is provided with at least two trenches, wherein the KE of the first trench is arranged at an angle of approximately 109° with respect to the KE of the second trench.

In an embodiment, the trenches comprises a long KE which has a length exceeding the distance between two adjacent charged particle beams in the multi charged particle beam lithography system. The advantage of such long KE's is that the same KE can be used for measuring the spot size of two or more adjacent charged particle beams, without having to rearrange the KE in a direction along a connecting line between the adjacent charged particle beams.

In an embodiment, the mis-cut Si wafer is provided with at least two trenches, wherein the long KE of the first trench is arranged at an angle of approximately 109° with respect to the long KE of the second trench.

In an embodiment, the scintillating material comprises Yttrium-Aluminium-Garnet (YAG).

In an embodiment, the knife edge structure is arranged at a distance from the scintillating material. In an embodiment, the distance between the knife edge structure and the scintillating material is approximately equal to the thickness of the Si wafer, in particular the bulk layer of the Si wafer is arranged between the knife edge structure and the scintillating material. In a further embodiment, the knife edge structure is arranged at a side of the Si wafer which faces away from the scintillating material.

In an embodiment, the device is provided with a layer in between the Si wafer and the scintillating material, which layer is provided with a diaphragm opening which is arranged for limiting an opening angle of a beam to reach the scintillating material. The layer, which is also referred to as a visor in this application, is arranged for transmitting the primary charged particle beam to reach the scintillating material, and for substantially blocking scattered charged particles. In an embodiment the layer comprises a Tungsten layer, which is arranged on top of the scintillating material.

In an embodiment, the Si wafer is provided with a through opening, wherein a first edge of the through opening is suitable as a KE and wherein a second edge, opposite and parallel to the first edge, is arranged in close proximity to the first edge for limiting an opening angle of a charged particle beam to pass through said through opening. In an embodiment, the first and second edge are arranged for limiting the opening angle to less than 5°, preferably less than 2°, more preferably to an angle of approximately 1.5°.

According to a second aspect, the invention provides a method for manufacturing a device for spot size measurement at wafer level in a multi charged particle beam lithography system, wherein said method comprises the steps of:

providing Si wafer having a top plane at a sharp angle to a (1 1 0) plane of the Si, etching a through opening in the Si wafer, and arranging said Si wafer with through opening on top of a scintillating material.

In an embodiment, at least part of the etching process is performed using a wet etching agent, such as KOH. Due to the wet etching the edges of the through opening align along crystal planes of the Si, yielding sharp and well defined edges of which at least one is suitable for use as a KE.

In a further embodiment, the etching process comprises a first step using a dry-etching process for creating the through opening, and a subsequent second step using a wet etching agent. The first step provides the rough shape of the trough opening, whereas the second step provides the sharp en well defined edges for use as a KE. It usually requires only a few minutes of wet-etching in order to obtain the sharp and well defined edges.

According to a third aspect, the invention provides a multi charged particle beam lithography system comprising a device for measuring the spot size of a charged particle beam at wafer level as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
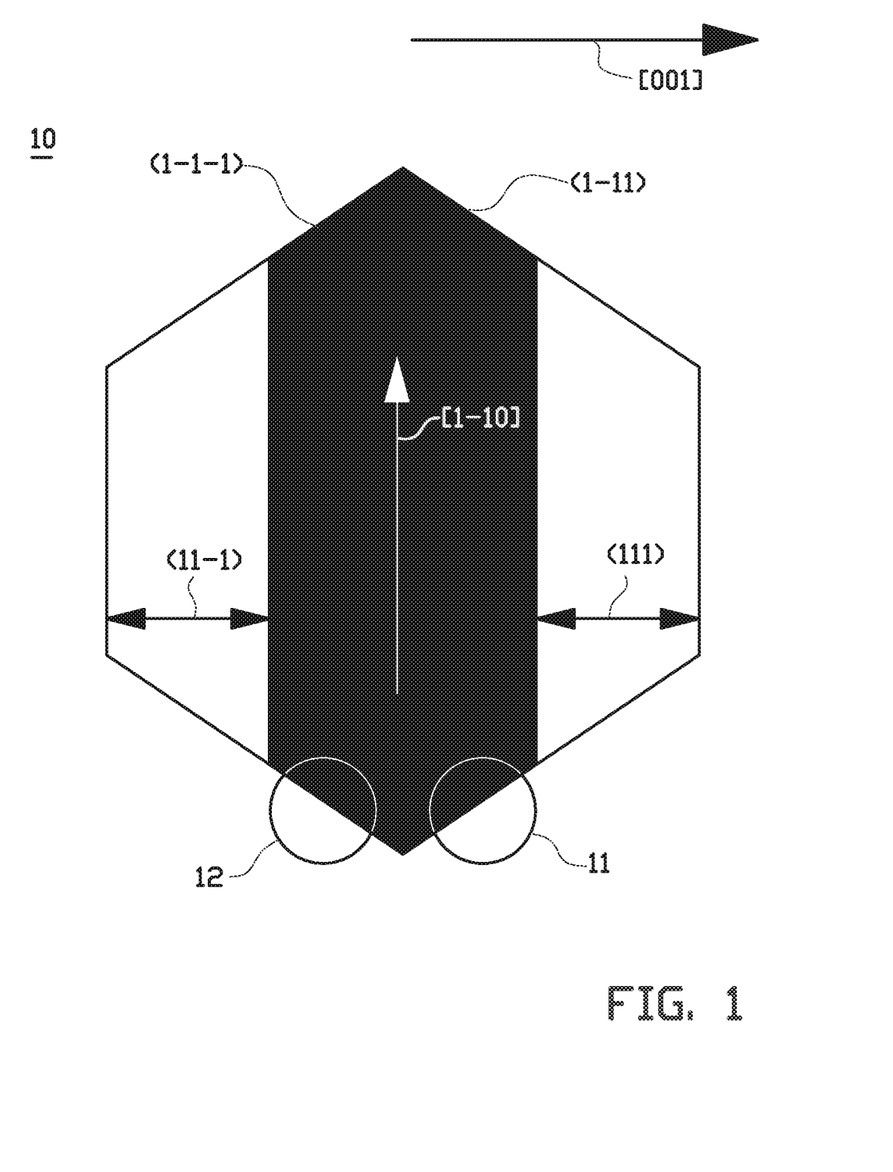
FIG. 1 shows a top view of a mis-cut Si wafer provided with a through opening comprising edges suitable for use as a KE.

FIG. 1 shows a first example of a Silicon Knife Edge (Si KE) according to the invention. The image of FIG. 1 shows the top surface 10 of a mis-cut Si wafer in which a through opening has been etched by a wet-etching process. The Si wafer is mis-cut such that het top plane of the Si wafer is arranged at an angle of approximately 3° to the (1 1 0) crystal plane of the Si.

Due to the crystal structure of Si, wet etching agents such as KOH, TMAH, hardly attack the (1 1 1) crystal planes of the Si. Therefore the through opening obtained is limited by (1 1 1) planes, in particular the planes (−1 1 1), (1 −1 1), (1 1 1) and their opposites (1 −1 −1), (−1 1 −1), (−1 −1 −1), as indicated in FIG. 1. When arranged into a symmetrical figure, these planes form an octahedron.

The edges between the top plane and the (1 −1 −1) or the (1 −1 1) crystal planes, can be used for KE measurement. In particular the edges between the top plane and the (1 −1 −1)

or the (1 −1 1) crystal planes which have an undercut angle with respect to the top surface. In FIG. 1 these edges are marked by the circles 11, 12.

When the Si wafer the (0 0 1) direction in the Si crystal is used as the axis of rotation for providing the sharp angle between the top plane and the (1 1 0) plane, as is the case in the example of FIG. 1, both the edges between the top plane and the (1 −1 −1) and the (1 −1 1) crystal planes can be used as KE. As shown, the angle between the first edge 11 between the top plane and the (1 −1 −1) crystal plane, and the second edge 12 between the top plane and the (1 −1 1) crystal plane, is approximately 109°, in particular approximately 109.47°. Using both these KE's yields spot sizes in two, roughly orthogonal, directions.

Figure 2:
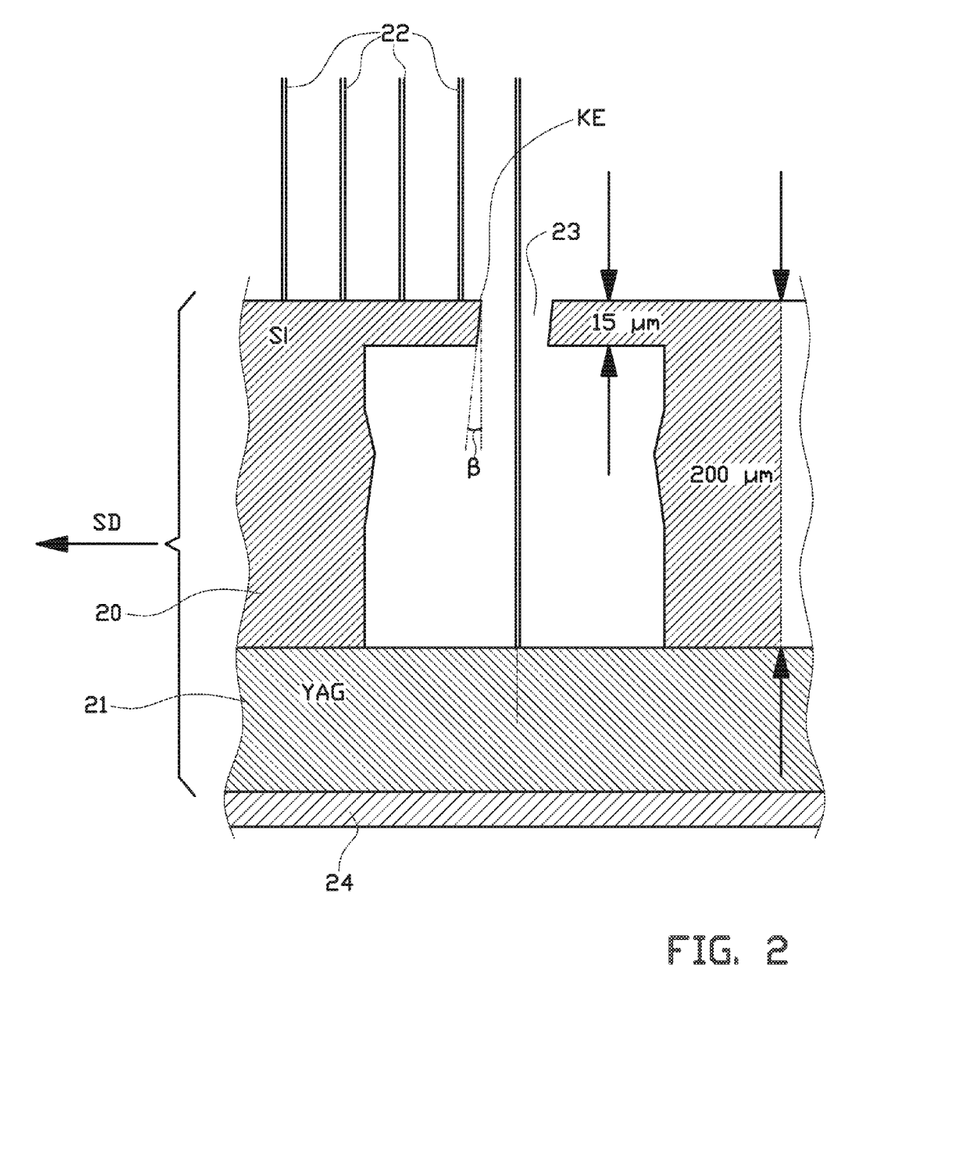
FIG. 2 shows a schematic cross-section of an second example embodiment of a device according to the invention.

FIG. 2 shows a schematic cross section of a part of an example of a device according to the invention. The device comprises a mis-cut Si wafer 20 in which a through opening 23 has been etched by an etching process. Again Si wafer 20 is mis-cut such that het top plane of the Si wafer 20 is arranged at an angle of approximately 3° to the (1 1 0) crystal plane of the Si. Due to the mis-cut at least one of the edges of the through opening 23 comprises a side wall at an undercut angle β, which is used a knife edge KE.

As shown in the cross-section of FIG. 2, the thickness of the Si Wafer 20 at and around the knife edge structure has been reduced to approximately 15 micron. The total thickness of the Si wafer 20 is approximately 200 micron. This Si wafer 20 is arranged on top of a scintillating material 21, in this example a YAG crystal, and the scintillating material is arranged on top of a light detector 24, for example a CCD device.

The knife edge structure KE is arranged at a side of the Si wafer 20 which faces away from the scintillating material 21. Thus the knife edge KE is arranged at a distance from the scintillating material, which distance is substantially equal to the thickness of the Si wafer 20.

In order to measure the spot size of the charged particle beams 22, the device is moved with respect to the beams 22 in the scanning direction SD in order to scan each of said beams 22 across the knife edge KE. Alternatively, it is also possible to move the charged particle beams 22 with respect to the device. When at least part of a charged particle beam 22 passes the knife edge KE and impinges on the YAG crystal 21, the charged particles are converted into photons, which are detected by the light detector 24. A measure for the spot size of a beam 22 at the position of the knife edge 22 can be derived from the change of the signal from the light detector 24 during the scanning of a beam 22 across the knife edge KE.

Figure 3:
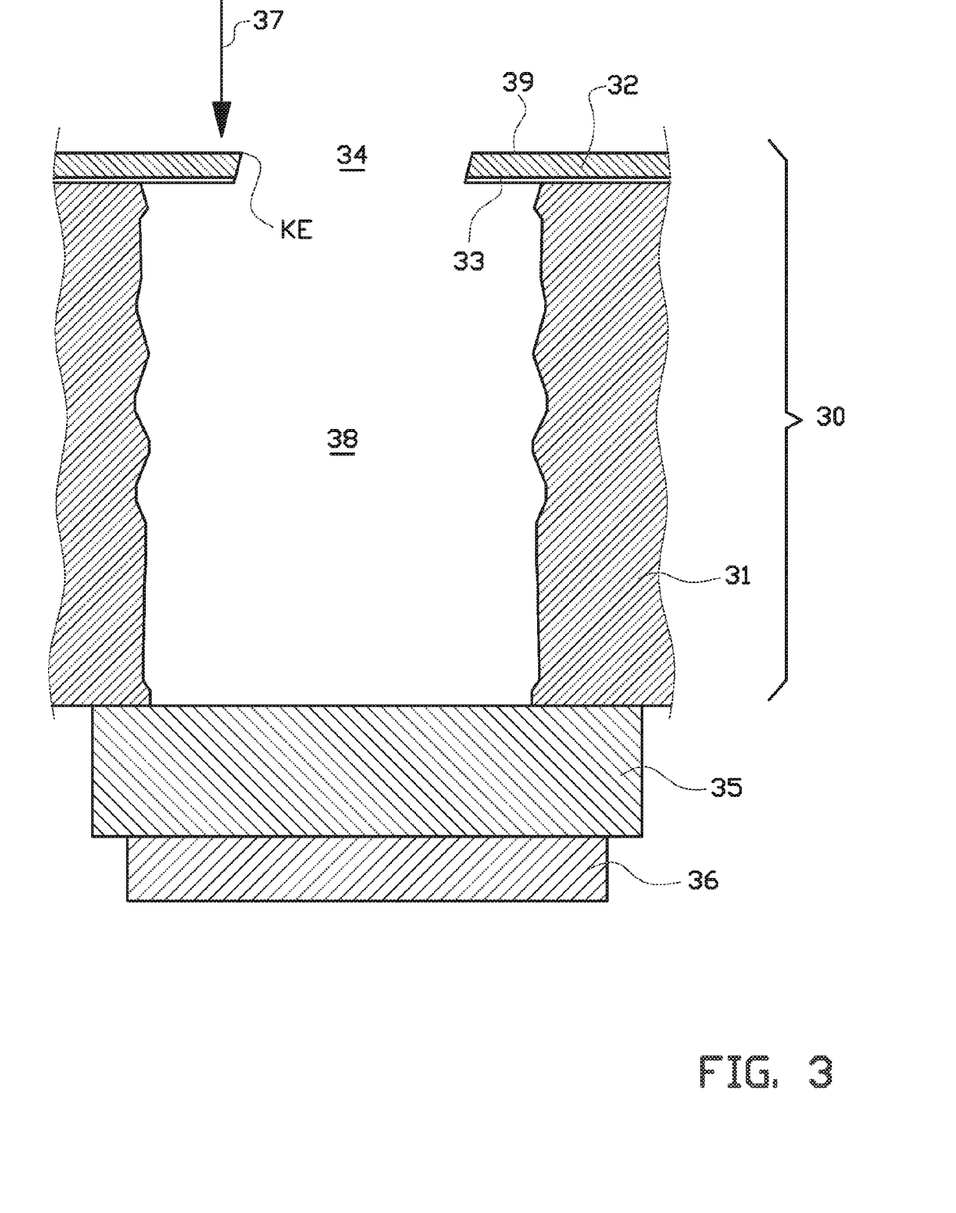
FIG. 3 shows a schematic cross-section of a third example embodiment of a device according to the invention.

FIG. 3 shows a schematic cross section of a part of a further example of a device according to the invention. The device comprises a mis-cut SOI wafer 30 comprising a bulk Si layer 31, topped by a thin top layer 32, wherein a layer 33 of SiO2 is arranged between the bulk layer 31 and the thin top layer 32. As shown in FIG. 3, the knife edge structure KE is arranged in the thin top layer 32, the use of a SOI wafer is advantageous because the SiO2 layer stops the wet etching process. The through opening 34 was wet etched from the top side. From the other side, holes 38 were made by a dry etching process, which holes 38 are larger than the through opening 34, in particular in de direction parallel to the top surface 39 of the wafer 30.

Since the knife edge KE is arranged in the thin top layer, which for example is 8 microns thick, the thickness of the Si Wafer 30 at and around the knife edge structure KE has been reduced to approximately 8 micron. The total thickness of the Si wafer 30 is approximately 330 micron.

This Si wafer 30 is arranged on top of a scintillating material 35, in this example a YAG crystal, and the scintillating material is arranged on top of a light detector 36, for example a CCD device. The knife edge structure KE is arranged at a side of the Si wafer 30 which faces away from the scintillating material 35. Thus the knife edge KE is arranged at a distance from the scintillating material, which distance is substantially equal to the thickness of the bulk layer of the Si wafer 30.

Figure 4:
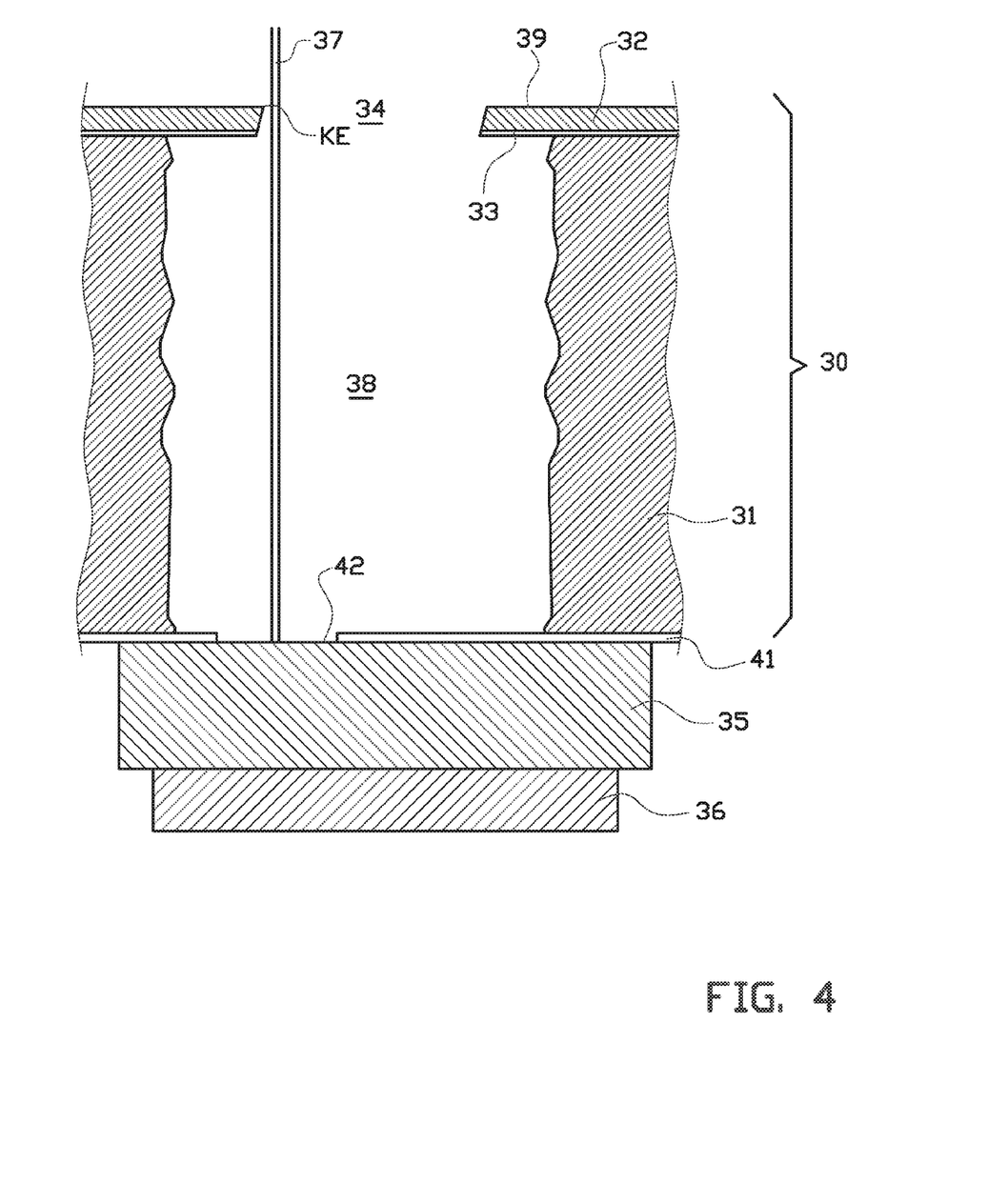
FIG. 4 shows a schematic cross-section of a fourth example embodiment of a device according to the invention, wherein a visor is arranged on top of the scintillating material.

FIG. 4 shows a schematic cross section of a part of a further example of a device according to the invention. This example is to a large extend the same as the example shown in FIG. 3, except for the provision of a visor 41. The visor 41 is arranged in between the Si wafer 31 and the scintillating material 35 and comprises a diaphragm 42 is arranged for limiting an opening angle of a beam 37 to reach the scintillating material 35. The visor 41 comprises a Tungsten pattern on top of the scintillating material 35.

Figure 5:
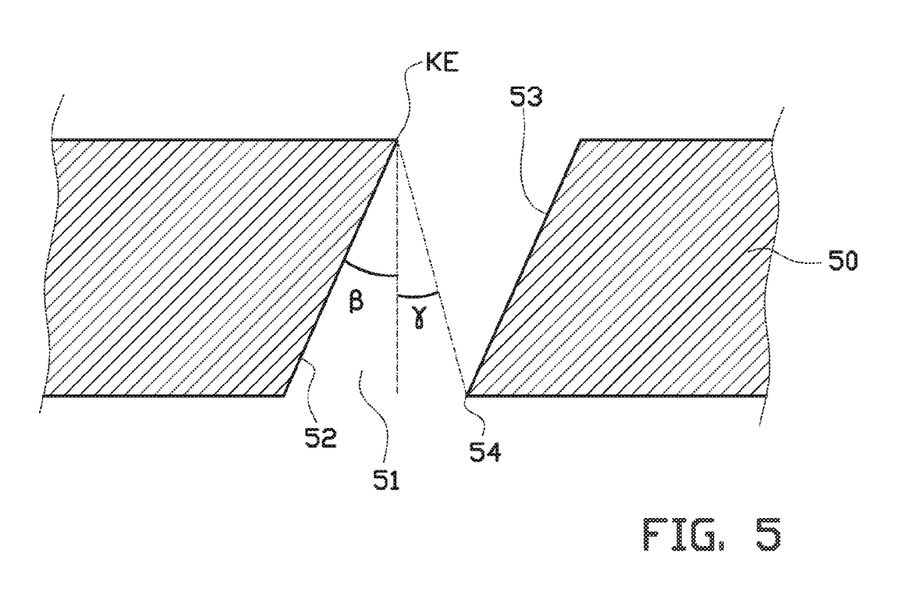
FIG. 5 shows a schematic cross-section of a fifth example, wherein the Si layer is also used as a visor.

FIG. 5 shows a schematic cross section of part of a device of the invention, wherein the Si layer 50 is also used as a visor. As shown the Si layer 50 is provided with a through opening 51 having a first edge which suitable for use as a knife edge KE. The side wall 52 of the through opening at the first edge KE is arranged at the undercut angle β, due to the mis-cut of the Si wafer is already discussed above. The through opening in this example comprises a second side wall 53, opposite and parallel to the first side wall 52, which second side wall 53 is arranged in close proximity to the first side wall 52 for limiting an opening angle γ of a charged particle beam to pass through said through opening 51. Thus, the first edge KE of the through opening and a second edge 54, opposite and parallel to the first edge KE, is arranged in close proximity to the first edge KE for limiting an opening angle γ of a charged particle beam to pass through said through opening 51. In this configuration, charged particles which are scattered by the Si at or near the first edge KE are at least substantially blocked by the second side wall 53. The second side wall 53 thus acts as a visor.

Preferably the first KE and second 54 edge are arranged for limiting the opening angle γ to less than 5°, preferably less than 2°, more preferably to an angle of approximately 1.5°.

Figure 6:
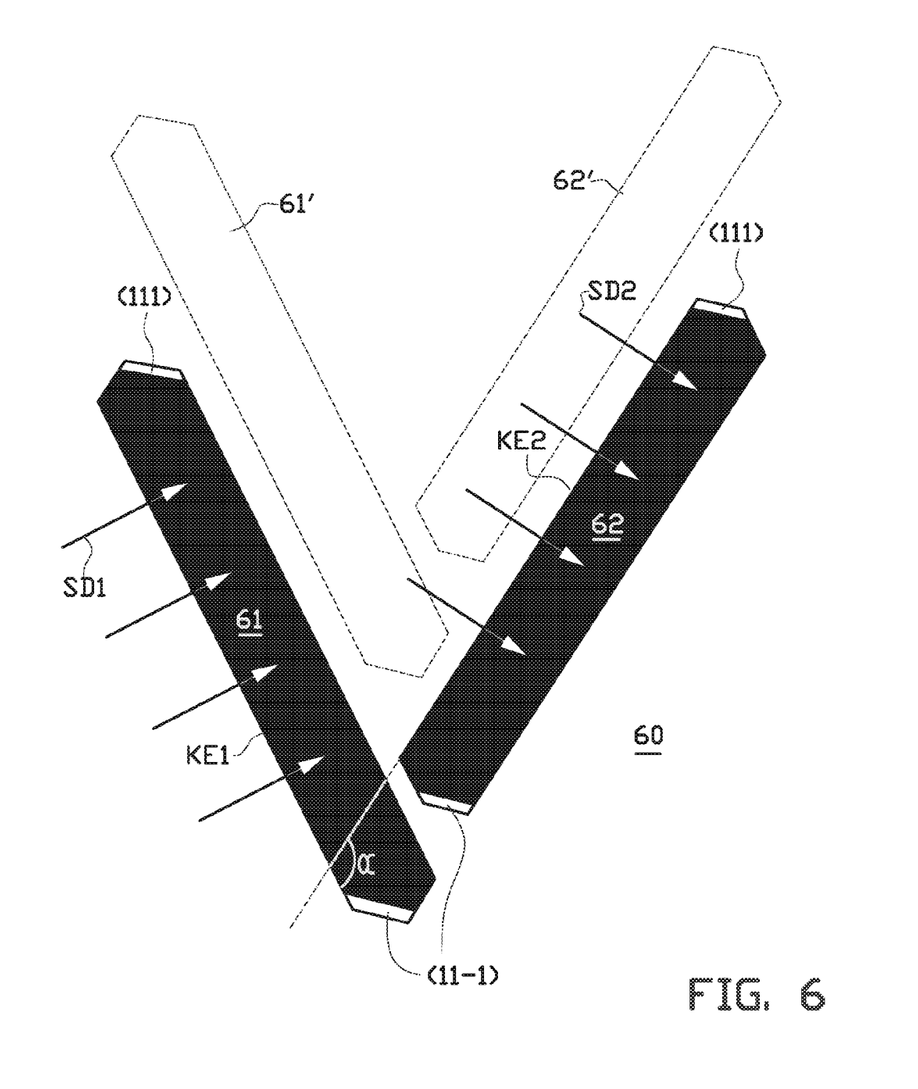
FIG. 6 shows a schematic top view of a further embodiment of a Silicon KE according to the invention.

FIG. 6 shows a top view of a part of a further example of a device according to the invention. In order to provide KE's the Si wafer 60 of this example is provided with one or more elongated trenches 61, 62, 61', 62'. As shown, the Si wafer 60 is provided with at least two trenches, wherein the knife edge KE1 of the first trench 61 is arranged at an angle α of approximately 109° with respect to the knife edge KE2 of the second trench 62. Such a trench 61, 62 thus provides a long knife edge KE1, KE2 which can be used for two or more adjacent charged particle beams without having to rearranged the Si wafer, as indicated by the arrows in FIG. 6. The one or more trenches 61, 62, 61', 62' comprises a long knife edge KE1, KE2 which has a length exceeding the distance between two adjacent charged particle beams in the multi charged particle beam lithography system.

For determining the spot size of an individual beam, this beam is 'on' while the other beams are 'off'. By moving the device relative to the beam in a first scan direction SD1 the spot size in this first scan direction is determined. By moving the device relative the beam in a second scan direction SD2 the spot size in this second scan direction is determined. Subsequently the measured beam is switched 'off' and one of the other beams is switched 'on' for measuring its spot size.

Figure 7:
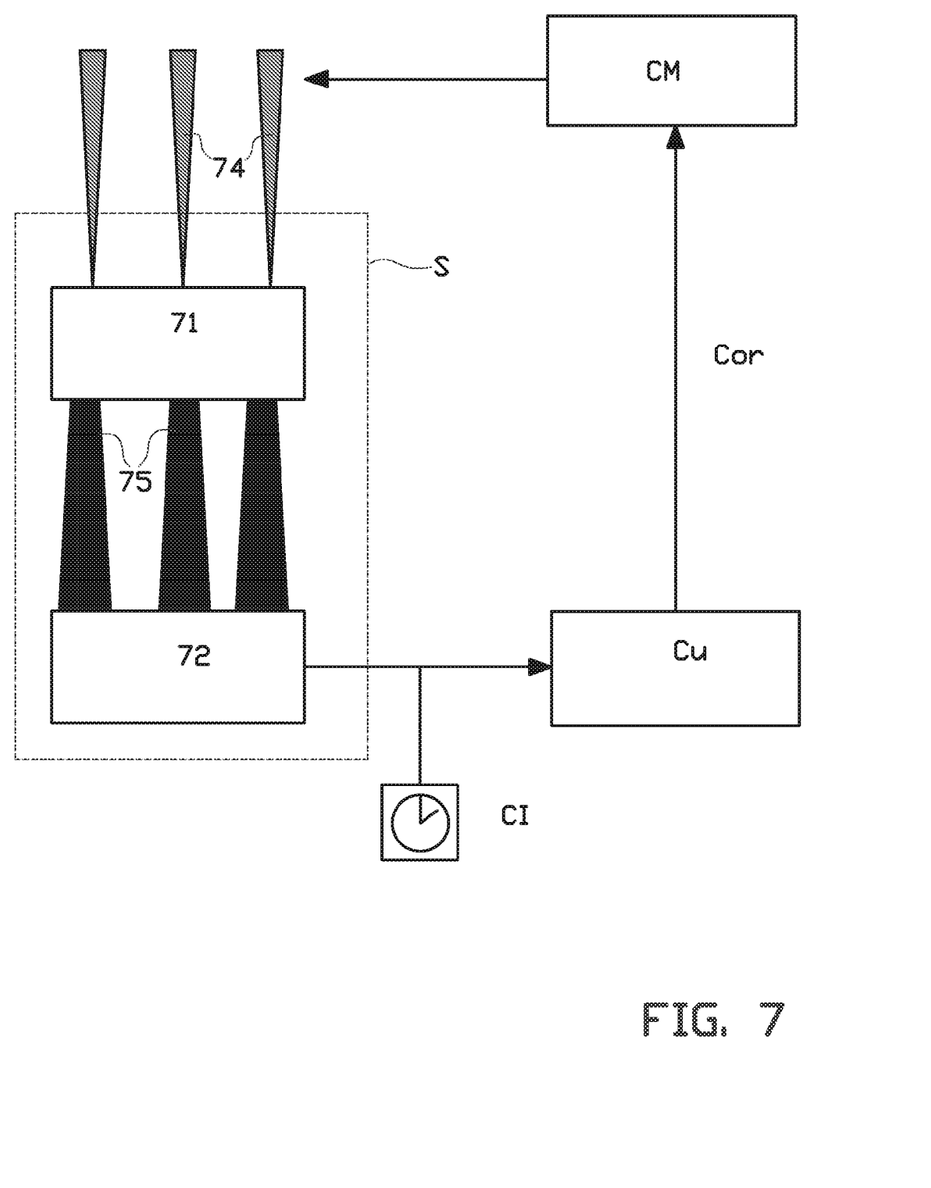
FIG. 7 shows a schematic view of a multi charged particle beam lithography system with a device for measuring the spot size of a charged particle beam at wafer level.

FIG. 7 illustrates a multi charged particle beam lithography system with a device 71 for measuring the spot size of a charged particle beam at wafer level. The device 71 according to the invention is arranged in the multi charged particle beam lithography system, such that the Si wafer with the knife edge is arranged at the wafer level of the lithography system. The charged particle beams are focussed on the wafer level. At each charged particle beam 74 a Si knife edge is arranged, as described in more detail above. By moving the arrangement S with respect to the charged particle beams 74, the beams 74 are scanned across the knife edges. When the beams at least partially pass the knife edge, the beams impinge on the scintillating material, which results in the emission of a light beam 75, which is detected by a camera 72, i.e. at least by a photon receptor or a CCD device 72.

During the movement of the arrangement S, the individual cells of a CCD device are read out in a conventional manner and data is provided to a calculating unit Cu in the system. The calculating unit determines the spot size of the individual charged particle beams 74.

In this respect it is noted that the charged particle beams 74 shown in FIG. 7 are only first set of all charged particle beams available in the lithography system. This set is selected so that the individual beams are spaced apart at a distance to allow the measuring of the spot size of the individual beams 74 simultaneously. For example the distance between the beams is matched to the dimensions of the individual cells of the CCD device.

When the spot size has been measured of the first set op charged particle beams 74, the Control device CM switches the beams 74 of this particular set 'off' and switches an adjacent charged particle beam 'on' for providing a second set of charged particle beams of which the spot sizes is then determined.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Device for simultaneous spot size measurement of a plurality of charged particle beams at wafer level in a multi charged particle beam lithography system, comprising a plurality of knife edge structures on top of a scintillating material, characterized in that the knife edge structures are arranged in a mis-cut Si wafer which has a top plane at a sharp angle to a (1 1 0) plane of a Si crystal used for the Si wafer, such that each knife edge structure is formed by an etched through opening in said Si wafer comprising at least one edge with an undercut angle which is suitable for use as a knife edge, when the top plane of the Si wafer is substantially arranged in a focus plane of the multi charged particle beam lithography system.

2. Device according to claim 1, wherein the angle is in a range from 2 to 4 degrees.

3. Device according to claim 2, wherein the angle is in a range from 2.9-3.1 degrees.

4. Device according to claim 1, wherein the [0 0 1] direction in the Si crystal is used as the axis of rotation for providing the sharp angle between the top plane and the (1 1 0) plane.

5. Device according to claim 1, wherein thickness of the Si wafer at and around the knife edge structure has been reduced.

6. Device according to claim 5, wherein the thickness of the Si wafer at and around the knife edge structures is in a range from 10 to 20 micron.

7. Device according to claim 5, wherein the wafer is a SOI wafer comprising a bulk Si layer, topped by a thin Si top layer, wherein a layer of SiO2 is arranged between the bulk layer and the thin top layer, and wherein the knife edge structures are arranged in the thin Si top layer.

8. Device according to claim 1, wherein the knife edge structures comprises one or more elongated trenches.

9. Device according to claim 8, wherein the Si wafer is provided with at least two trenches, wherein the knife edge of the first trench is arranged at an angle of approximately 109° with respect to the knife edge of the second trench.

10. Device according to claim 8, wherein the one or more trenches comprises a long knife edge which has a length exceeding the distance between two adjacent charged particle beams in the multi charged particle beam lithography system.

11. Device according to claim 1, wherein the knife edge structure is arranged at a distance from the scintillating material.

12. Device according to claim 11, wherein the knife edge structure is arranged at a side of the Si wafer which faces away from the scintillating material.

13. Device according to claim 1, wherein a first edge of the through opening is suitable as a knife edge and wherein a second edge, opposite and parallel to the first edge, is arranged in close proximity to the first edge for limiting an opening angle of a charged particle beam to pass through said through opening.

14. Device according to claim 13, wherein the first and second edge are arranged for limiting the opening angle to less than 5°.

15. Multi charged particle beam lithography system comprising a device for simultaneous spot size measurement of a plurality of charged particle beams at wafer level, comprising a plurality of knife edge structures on top of a scintillating material, characterized in that the plurality of knife edge structures are arranged in a mis-cut Si wafer which has a top plane at a sharp angle to a (1 1 0) plane of a Si crystal used for the Si wafer, such that a plurality of etched through opeinings in said Si wafer each comprises at least one edge with an undercut angle which is suitable for use as a knife edge, when the top plane of the Si wafer is substantially arranged in a focus plane of the multi charged particle beam lithography system.

16. Device for spot size measurement at wafer level in a multi charged particle beam lithography system, comprising a knife edge structure on top of a scintillating material, characterized in that the knife edge structure is arranged in a Si wafer which has a top plane at a sharp angle to a (1 1 0) plane of a Si crystal used for the Si wafer, such that an etched through opening in said Si wafer comprises at least one edge with an undercut angle which is suitable for use as a knife edge, when the top plane of the Si wafer is substantially arranged in a focus plane of the multi charged particle beam lithography system, wherein the [0 0 1] direction in the Si crystal is used as the axis of rotation for providing the sharp angle between the top plane and the (1 1 0) plane.

17. Device according to claim 16, wherein the angle is in a range from 2 to 4 degrees.

18. Device according to claim 16, wherein the angle is in a range from 2.9-3.1 degrees.

19. Device according to claim 1, wherein thickness of the Si wafer at and around the knife edge structure has been reduced.

20. Device according to claim 19, wherein the thickness of the Si wafer at and around the knife edge structures is in a range from 10 to 20 micron.

21. Device according to claim 19, wherein the wafer is a SOI wafer comprising a bulk Si layer, topped by a thin Si top layer, wherein a layer of SiO2 is arranged between the bulk Si layer and the thin Si top layer, wherein the knife edge structures are arranged in the thin Si top layer.

22. Device according to claim 16, wherein the Si wafer at and around the knife edge structures is provided with support walls.

23. Device according to claim 22, wherein the support walls have a height, as measured in a direction perpendicular to the top plane of the wafer, in a range from 130 to 300 micron.

24. Device according to claim 16, wherein the knife edge structures comprises one or more elongated trenches.

25. Device according to claim 24, wherein the Si wafer is provided with at least two trenches, wherein the knife edge of the first trench is arranged at an angle of approximately 109° with respect to the knife edge of the second trench.

26. Device according to claim 24, wherein the one or more trenches comprises a long knife edge which has a length exceeding the distance between two adjacent charged particle beams in the multi charged particle beam lithography system.

27. Device according to claim 16, wherein the knife edge structure is arranged at a distance from the scintillating material.

28. Device according to claim 27, wherein the distance between the knife edge structure and the scintillating material is approximately equal to the thickness of the Si wafer.

29. Device according to claim 27, wherein the knife edge structure is arranged at a side of the Si wafer which faces away from the scintillating material.

30. Device according to claim 27, wherein in between the Si wafer and the scintillating material a layer is arranged, which layer is provided with a diaphragm opening which is arranged for limiting an opening angle of a charged particle beam to reach the scintillating material.

31. Device according to claim 30, wherein the layer comprises a Tungsten layer, which is arranged on top of the scintillating material.

32. Device according to claim 16, wherein the Si wafer is provided with a through opening, wherein a first edge of the through opening is suitable as a knife edge and wherein a second edge, opposite and parallel to the first edge, is arranged in close proximity to the first edge for limiting an opening angle of a charged particle beam to pass through said through opening.

33. Device according to claim 32, wherein the first and second edge are arranged for limiting the opening angle to less than 5°.

34. Method for manufacturing a device for spot size measurement at wafer level in a multi charged particle beam lithography system, wherein said method comprises the steps of:

providing a Si wafer having a top plane at a sharp angle to a (1 1 0) plane of a Si crystal used for the Si wafer such that an etched through opening in said Si wafer comprises at least one edge with an undercut angle which is suitable for use as a knife edge, when the top plane of the Si wafer is substantially arranged in a focus plane of the multi charged particle beam lithography system, wherein the [0 0 1] direction in the Si crystal is used as the axis of rotation for providing the sharp angle between the top plane and the (1 1 0) plane, etching a through opening in the Si wafer, and arranging said Si wafer with through opening on top of a scintillating material.

35. Method according to claim 34, wherein at least part of the etching process is performed using a wet etching agent.

36. Method according to claim 34, wherein the etching process comprises a first step using a dry-etching process for creating the through opening, and a subsequent second step using a wet etching agent.

37. Multi charged particle beam lithography system comprising a device for spot size measurement at wafer level, comprising a knife edge structure on top of a scintillating material, characterized in that the knife edge structure is arranged in a Si wafer which has a top plane at a sharp angle to a (1 1 0) plane of a Si crystal used for the Si wafer, such that an etched through opening in said Si wafer comprises at least one edge with an undercut angle which is suitable for use as a knife edge, when the top plane of the Si wafer is substantially arranged in a focus plane of the multi charged particle beam lithography system, wherein the [0 0 1] direction in the Si crystal is used as the axis of rotation for providing the sharp angle between the top plane and the (1 1 0) plane.

* * * * *